United States Patent
Tanaka

(10) Patent No.: US 6,756,675 B1
(45) Date of Patent: Jun. 29, 2004

(54) SEMICONDUCTOR DEVICE AND A METHOD FOR MAKING THE SAME THAT PROVIDE ARRANGEMENT OF A CONNECTING REGION FOR AN EXTERNAL CONNECTING TERMINAL

(75) Inventor: Kazuo Tanaka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/586,963

(22) Filed: Jun. 5, 2000

Related U.S. Application Data

(62) Division of application No. 08/914,095, filed on Aug. 19, 1997, now Pat. No. 6,100,589.

(30) Foreign Application Priority Data

Aug. 20, 1996 (JP) ............................................. 8-237310

(51) Int. Cl.⁷ .......................... H01L 23/48; H01L 23/52; H01L 29/40
(52) U.S. Cl. .......................... 257/758; 257/750; 257/781
(58) Field of Search ................................. 257/750–751, 257/650–651, 758–765, 781; 438/107–118

(56) References Cited

U.S. PATENT DOCUMENTS

| | | | |
|---|---|---|---|
| 5,229,642 A | | 7/1993 | Hara et al. |
| 5,736,791 A | * | 4/1998 | Fujiki et al. ................ 257/781 |
| 5,739,587 A | * | 4/1998 | Sato ............................. 257/758 |
| 5,751,065 A | | 5/1998 | Chittipeddi et al. |
| 5,847,466 A | | 12/1998 | Ito et al. |
| 5,866,441 A | * | 2/1999 | Pace ........................... 438/108 |

FOREIGN PATENT DOCUMENTS

| | | | |
|---|---|---|---|
| JP | 402086193 A | * | 3/1990 |
| JP | 04-167449 A | | 6/1992 |
| JP | 06-260529 A | | 9/1994 |
| JP | 06-326150 A | | 11/1994 |
| JP | 07-263446 A | | 10/1995 |
| JP | A-8-45933 | | 2/1996 |
| JP | 08-045933 A | | 2/1996 |
| JP | 08-051153 A | | 2/1996 |
| JP | A-8-293523 | | 11/1996 |

* cited by examiner

*Primary Examiner*—Cuong Nguyen
(74) *Attorney, Agent, or Firm*—Oliff & Berridge, PLC

(57) ABSTRACT

A semiconductor device and a method for making the same that provide highly reliable and high density arrangement of a connecting region for an external connecting terminal, such as a bonding pad. Electrode layers are connected to each other through embedded conductive layers forming highly-superposed multi-layered structures without bumps. Openings are provided in a second electrode layer, a first insulating interlayer and a second insulating interlayer. The above layers are connected to each other through openings. A prop of the insulating interlayer film is formed between the third electrode layer and the first electrode layer. The props prevent cracks from forming in the insulating interlayers when a load is applied during wire-bonding.

7 Claims, 18 Drawing Sheets

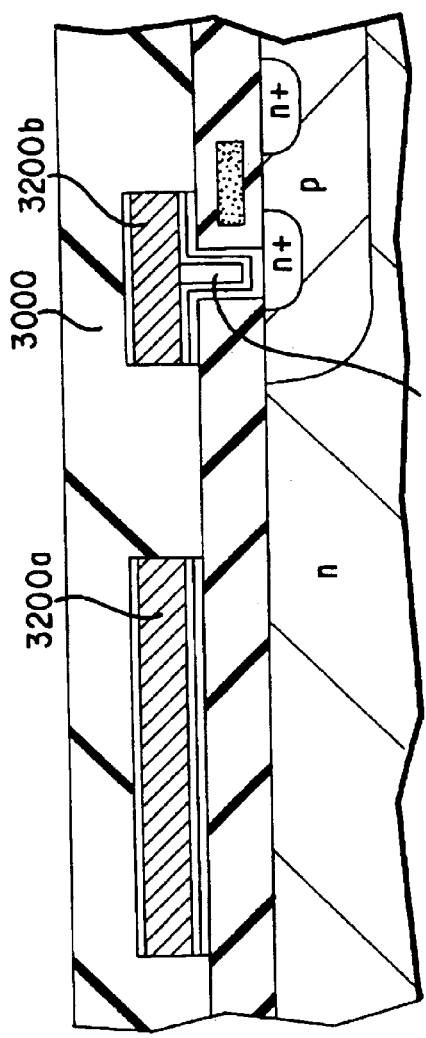
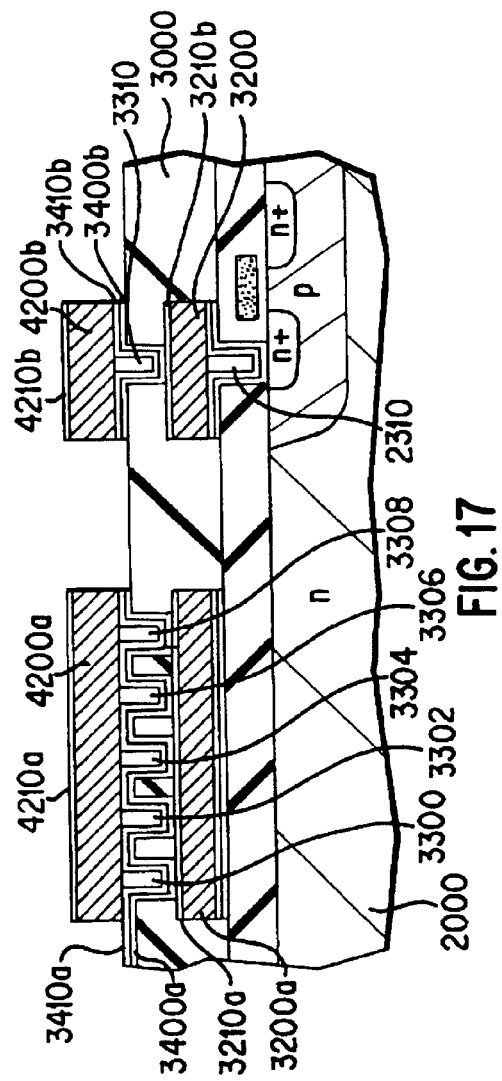

SEMICONDUCTOR DEVICE AND A METHOD FOR MAKING THE SAME THAT PROVIDE ARRANGEMENT OF A CONNECTING REGION FOR AN EXTERNAL CONNECTING TERMINAL

This is a Division of application Ser. No. 08/914,095 filed Aug. 19, 1997 now U.S. Pat. No. 6,100,589. The entire disclosure of the prior application is hereby incorporated by reference herein in its entirety.

BACKGROUND OF THE INVENTION

1. Field of Invention

The present invention relates to semiconductor devices and methods for making the same, and particularly, an electrode structure for connecting an external connecting terminal, such as a bonding wire, to an IC chip and a method for making the same.

2. Description of Related Art

A high density arrangement of electrodes (pads) for connecting external connecting terminals, such as a bonding wire, has been required due to the increasing integration density of ICs.

A cross-sectional view of a bonding pad formed using three layers of wiring is exemplified in FIG. 23.

In a structure as shown in FIG. 23, some problems, such as disconnection due to bumps of aluminum wiring and a narrowed bonding region, often arise.

Specifically, when superposing an aluminum pad 8010 as a first layer, an aluminum pad 8110 as a second layer and an aluminum pad 8310 as a third layer, the thickness of each aluminum layer decreases due to a steep slope between different levels, and disconnection due to bumps will readily occur. There is a fair possibility of disconnection due to bumps at a region surrounded with a chain-line circle 8500 in FIG. 23.

The bonding region decreases with an increased number of electrode layers. As shown in the bottom side of FIG. 23, the end of a region capable of bonding in the first pad layer 8010 is represented by P1, the end of a region capable of bonding in the second pad layer 8110 is represented by P2, the end of a region capable of bonding in the third pad layer 8310 is represented by P3, and thus a bonding region decreases as a new layer is superposed. When further superposition of the electrode layers is accelerated, the first electrode layer therefore must have a large area in order to secure the bonding area, and it is difficult to arrange the bonding pad with high density.

SUMMARY OF THE INVENTION

The present invention has been completed in view of the above-mentioned problems, and it is an object of the present invention to provide a semiconductor device and a method for making the same which are capable of high density arrangement of the connecting region for an external connecting terminal, such as a bonding pad, and which are highly reliable.

The present invention which solves the above-mentioned problems has the following construction:

(1) The present invention described in claim 1 is characterized by a semiconductor device having a multiple wiring layer structure, comprising:

a first conductive layer belonging to a first layer and connected to a conductive member for external connection;

a second conductive layer belonging to a second layer below the first layer and provided with a plurality of openings;

a third conductive layer belonging to a third layer below the second layer;

a first insulating interlayer disposed between the first conductive layer and the second conductive layer;

a first through hole provided in the first insulating interlayer;

a fourth conductive layer filled in the first through hole;

a second insulating interlayer disposed between the second conductive layer and the third conductive layer;

a second through hole provided in the second insulating interlayer; and a fifth conductive layer filled in the second through hole.

According to the claimed invention, the first to third conductive layers form a planar structure having no level differences. Thus, disconnection due to bumps will not occur. The bonding region of each layer always has a constant area in a multiple layer structure. High density bonding pad arrangement therefore can be achieved.

Herein, the term "second layer" means at least one layer of conductive layers (intermediate conductive layers) disposed between the first conductive layer and the third conductive layer.

Herein, "first and second layers" widely include, for example, oxide films, silicon nitride films, impurity containing oxide films, organic containing oxide films, insulating films comprising organic materials, and insulating films formed by superposing 2 or more types of the above-mentioned insulating films.

The second conductive layer is provided with openings, the first insulating interlayer and the second insulating interlayer are connected to each other through the openings, and a contiguous section of the insulating interlayer is, thereby, disposed between the first conductive layer and the second conductive layer. Namely, a contiguous prop comprising an insulating material as a constituent of the insulating film is disposed. Thus, no cracks form in the insulating interlayer, for example, when a load is applied during wire-bonding.

(2) The present invention described in claim 2 depending on claim 1, wherein the first insulating interlayer and the second insulating interlayer are connected to each other through the openings of the second conductive layer, and a contiguous section of the first insulating interlayer with the second insulating interlayer is, thereby, formed between the first conductive layer and the third conductive layer.

The provision of the contiguous section (prop) of a hard insulating interlayer is clarified.

In the present invention, openings are selectively provided in a conductive layer which is disposed in an intermediate section, and a contiguous prop is formed by connecting insulating interlayers through the openings, so that the prop carries a load applied to the uppermost layer. No cracks therefore form in the insulating interlayer. As a result, reliability of the semiconductor device improves.

Insulating interlayers of $SiO_2$ films and the like are generally harder than conductive layers (metal layers). If no openings are formed in the second conductive layer, the first insulating interlayer and the second insulating interlayer are mutually isolated, and each insulating interlayer is sandwiched between two conductive layers. When a load is impressed during wire-bonding, the soft conductive layers are strained, and the strained conductive layers impress the hard insulating interlayers. Cracks will readily form in the hard insulating interlayers disposed between the conductive layers. In contrast, in the present invention, the insulating interlayers can be protected by the contiguous prop and thus crack formation is prevented.

(3) The present invention described in claim 3 depending on claim 1, wherein the second conductive layer has a planar network pattern.

The intermediate conductive layer (the second conductive layer) disposed between the uppermost conductive layer (the first conductive layer) and the lowest conductive layer (the third conductive layer) is shaped into a mesh. Many openings can be effectively formed while maintaining a high current flow density of the second conductive layer.

(4) The present invention described in claim 4 depending on claim 1, wherein the third conductive layer is the lowest conductive layer formed on an insulating film covering a surface of a semiconductor substrate, and the third conductive layer is also provided with a plurality of openings.

Since openings are provided in the lowest conductive layer disposed below the prop of the external connecting terminal, the mechanical strength is further improved and effects for suppressing crack formation in the insulating interlayer is enhanced.

In the openings of the lowest conductive layer (the third conductive layer), the prop of the insulating film is directly connected to the insulating film which covers the surface of the semiconductor substrate, and a hard contiguous prop is formed without disposition of a conductive layer. Since the hard contiguous prop of an insulating film carries the uppermost electrode connected to the external connecting terminal, the strength against a pressure impressed from the upper side is further improved.

(5) The present invention described in claim 5 depending on claim 4, wherein the third conductive layer has a planar network pattern.

The third conductive layer is shaped into a mesh. Many openings can be effectively formed while maintaining a high current flow density of the third conductive layer.

(6) The present invention described in claim 4 depending on claim 1, wherein the conductive member for external connection is a bonding wire.

Cracks will readily form in the insulating interlayer due to an excessive load (impact) applied during wire-bonding. Use of a bonding pad having the above-mentioned structure therefore is effective.

Herein, the external connecting terminal is not limited to the bonding wire and also applicable to devices using tape carriers and those in which semiconductor chips are directly packaged on substrate using bump electrodes (flip chip packaging). In the present invention, the bonding pad is always planarized regardless of a trend toward multiple layer wiring, the external connecting terminal can be satisfactorily connected.

(7) The present invention described in claim 7 depending on claim 1, wherein the first conductive layer, the second conductive layer and the third conductive layer comprise aluminum as a major component, and the fourth conductive layer and the fifth conductive layer comprise tungsten as a major component.

The fourth and fifth conductive layers comprising tungsten as a major component enables satisfactory embedding.

(8) The present invention described in claim 8 depending on claim 1, wherein the semiconductor device further comprises an internal circuit, the internal circuit being formed by a multiple wiring layer structure; and the first conductive layer, the second conductive layer, the third conductive layer, the fourth conductive layer, the fifth conductive layer, the first insulating interlayer, the second insulating interlayer, the through holes, and the multiple wiring layer structure are formed by a collective production process.

A complicated production process can be prevented by forming the internal circuit and the connecting section with an external connecting terminal by a collective production process.

(9) The present invention described in claim 9 depending on claim 1, wherein the semiconductor device further comprises guard rings, the guard rings being provided around the multiple wiring layer structure connected to the conductive member for external connection; and the guard ring comprises:

a sixth conductive layer comprising the same material as the first conductive layer;

a seventh conductive layer comprising the same material as the second conductive layer;

an eighth conductive layer comprising the same material as the third conductive layer;

the first insulating interlayer and the second insulating interlayer;

a first groove provided on the first insulating interlayer;

a second groove provided on the second insulating interlayer;

a ninth conductive layer filled in the first groove; and a tenth conductive layer filled in the second groove.

If a crack forms in the insulating interlayer, the provided guard ring can prevent the crack from propagating to its circumference. The guard ring can also prevent penetration of water which invades through the bonding wire and the chip. Reliability of the semiconductor device therefore is improved.

(10) The present invention described in claim 10 is a method for making a semiconductor device having a multiple wiring layer structure connected to a conductive member for external connection, comprising the following steps (1) to (7) for forming the multiple wiring layer structure:

Step (1)

forming a first insulating interlayer on a first conductive layer;

Step (2)

selectively forming through holes in the first insulating interlayer;

Step (3)

depositing a first conductive material on the first insulating interlayer and in the through holes and embedding the first conductive material into the through holes by etching the entire surface thereof;

Step (4)

forming a second conductive layer on the first insulating interlayer so as to come into contact with the first conductive material embedded into the through holes;

Step (5)

forming a plurality of openings by patterning the second conductive layer;

Step (6)

forming a second insulating interlayer on the second conductive layer having the plurality of opening;

Step (7)

embedding second conductive material into through holes formed in the second insulating interlayer by the same steps as Step 1 to Step 3; and Step (8)

forming a third conductive layer on the second conductive layer so as to come in contact with the second conductive material embedded into the through holes.

A technology for forming a multi layer structure in fine semiconductor integrated circuits is also used for forming a bonding pad.

(11) The present invention described in claim 11 depending on claim 10, wherein the second conductive layer, formed in Step (6), having a plurality of openings has a planar network pattern.

The intermediate conductive layer is shaped into a mesh.

(12) The present invention described in claim 12 depending on claim 10, wherein a multiple wiring layer structure constituting an internal circuit of the semiconductor device is further formed by Step (1) to Step (8).

The multiple wiring layer structure in the internal circuit is also formed by the collective process.

(13) The present invention described in claim 13 depending on claim 10, wherein a guard ring is further formed by Step (1) to Step (8). The guard ring can also be readily formed by the collective process.

BRIEF DESCRIPTION OF THE DRAWINGS

The invention is described in detail with reference to the following drawings, wherein like numerals represent like elements and wherein:

FIG. 16 is a cross-sectional view illustrating a sixth step in a method for making a semiconductor device;

FIG. 17 is a cross-sectional view illustrating a seventh step in a method for making a semiconductor device;

DETAILED DESCRIPTION OF PREFERRED EMBODIMENTS

Embodiments in accordance with the present invention will now be described with reference to the drawings.

First Embodiment

Figure 1:
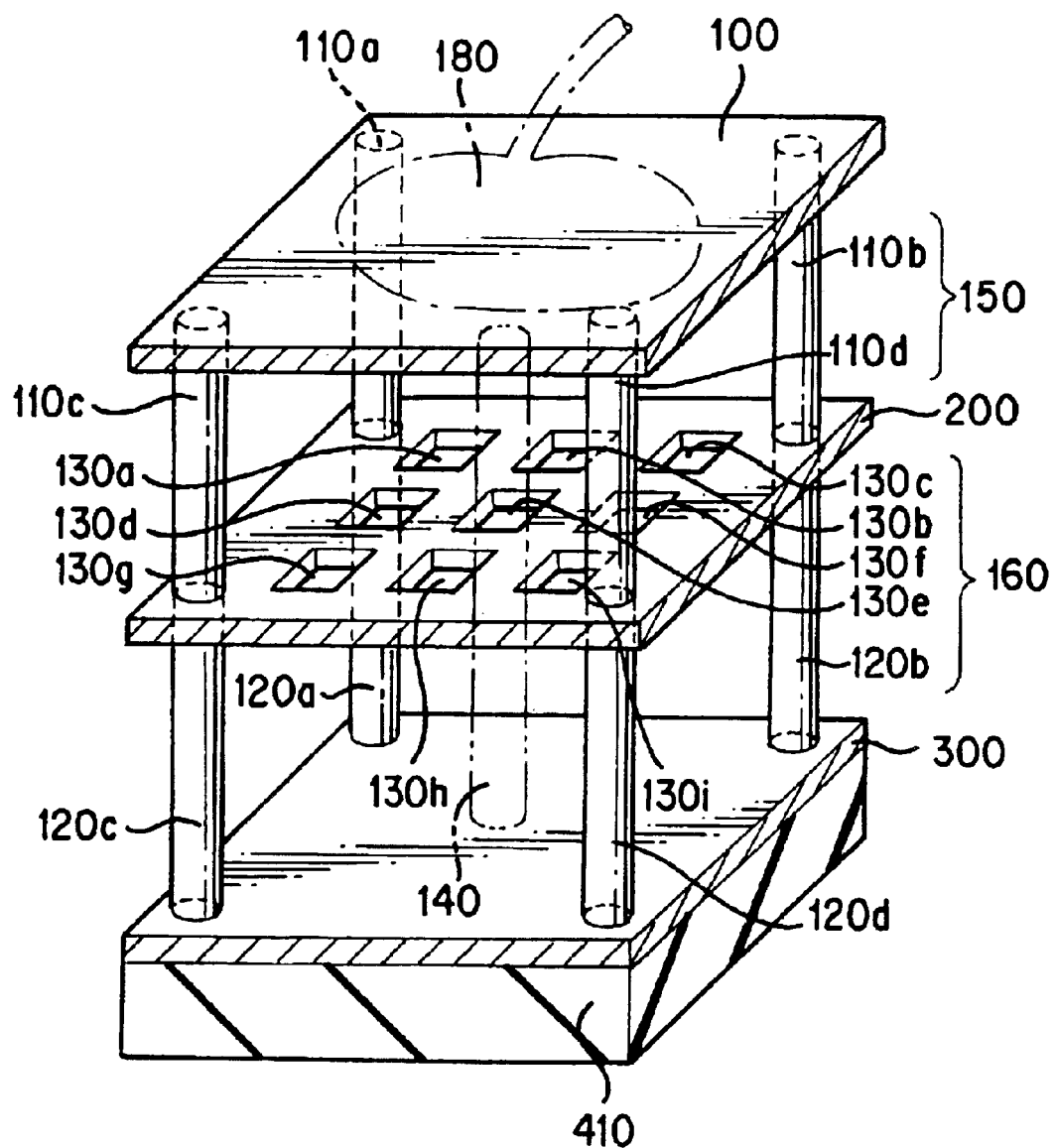
FIG. 1 illustrates a structure of a main section in a first embodiment of a semiconductor device.

FIG. 1 is a drawing illustrating a configuration of a main section in a first embodiment of a semiconductor device in accordance with the present invention.

As shown in FIG. 1, a bonding pad having a triple layer structure comprises a first electrode layer 300, a second electrode layer 200, a third electrode layer 100, a first insulating interlayer 160 provided with a plurality of through holes, conductive members 120a to 120d embedded into the through holes provided in the insulating interlayer 160, a second insulating interlayer 150 provided with a plurality of through holes, and conductive members 110a to 110d embedded into the through holes provided in the insulating interlayer 150. The first electrode layer 300 is formed on an oxide film (insulating film) 410 which covers the surface of the semiconductor substrate.

The bonding wire 180, represented by an alternate long and short dash line in FIG. 1, is connected to the uppermost third electrode layer.

Each electrode layer 100, 200, 300 is composed of, for example, aluminum as a major component, and each insulating interlayer is composed of, for example, a $SiO_2$ film. These layers, however, are not limited to such components, and examples of widely usable insulating interlayers include silicon nitride films ($Si_3N_4$ films), oxide films containing organic materials, oxide films containing impurities, insulating films comprising organic materials such as polyimides and Teflon, and insulating films formed by superposing two or more types of the above-mentioned insulating films.

The conductive members 110a to 110d and 120a to 120d embedded into the through holes are composed of, for example, tungsten.

The constituents of the electrodes and embedded conductive members are not limited to the above described materials, and various materials are also usable. For example, examples of constituents other than aluminum for each electrode 100, 200, 300 include tungsten, copper, gold, nickel-chromium-titanium, and alloys containing at least one component among these constituents (for example, metal nitride, such as TiN, WN, CuN and AuN; intermetallic compounds, such as Al—Ti, Al—W, Al—Ni and W—Ti; and silicides, such as $TiSi_2$, $WSi_2$ and $NiSi_2$).

The second electrode layer 200 is provided with a plurality of openings 130a to 130i. The first insulating interlayer 160 and the second insulating interlayer 150 are connected (bonded) to each other through the openings 130a to 130i. As a result, props 140 (shown with a two-dot chain line in FIG. 1) comprising the insulating interlayers are formed between the first electrode layer 300 and the second electrode layer 100.

Figure 2A:
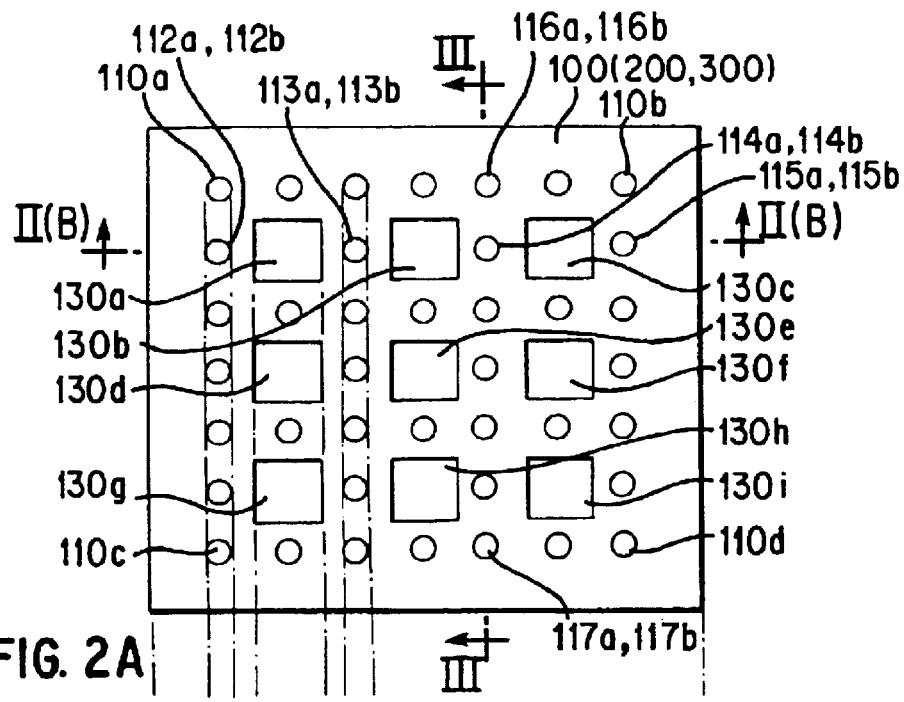
FIG. 2A is a plan view of the semiconductor device shown in FIG. 1.
Figure 2B:
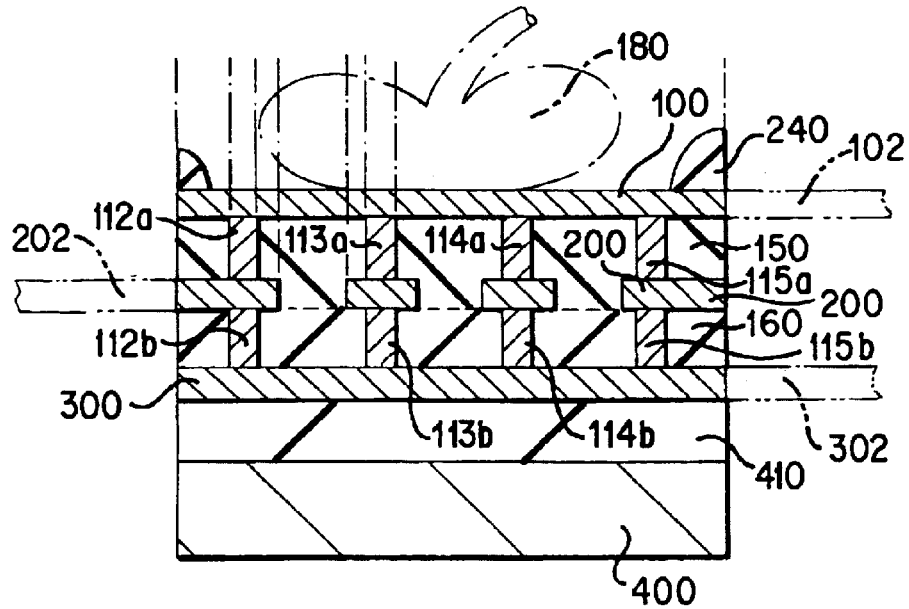
FIG. 2B is a cross-sectional view taken from line II(B)—II(B) of FIG. 1.

FIGS. 2A and 2B include a plan view (the upper side) of the bonding pad in FIG. 1 and a cross-sectional view (the lower side) taken from line II(B)—II(B). In the plan view, each constituent is described with a solid line for better comprehension in terms of a planar arrangement of each constituent. In FIGS. 2A–2B, conductive materials embedded into the through holes are described in more detail than FIG. 1. Thus, conductive materials referred to as identification numbers 110a, 110b to 117a, and 117b are added.

Figure 3:
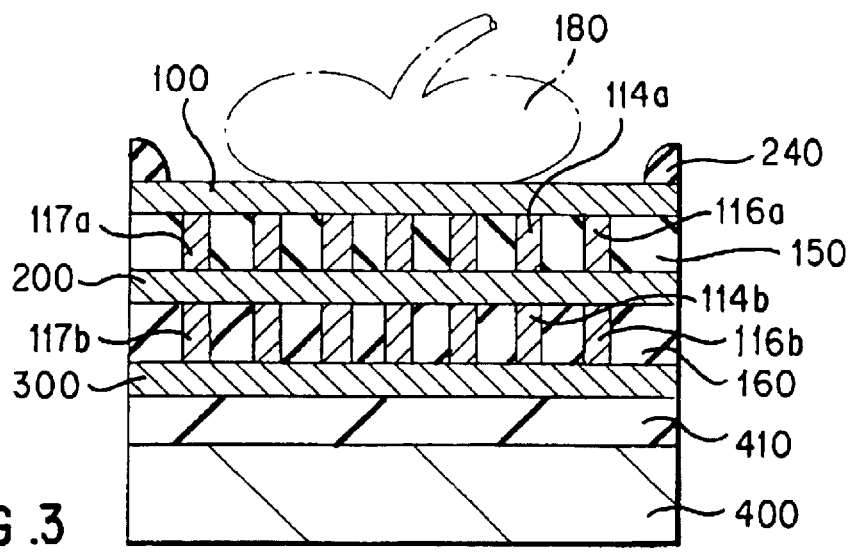
FIG. 3 is a cross-sectional view of the semiconductor device taken from line III—III of FIG. 2A.

FIG. 3 is a cross-sectional view of the bonding pad taken from line III—III in the plan view in FIG. 2A.

Figure 4:
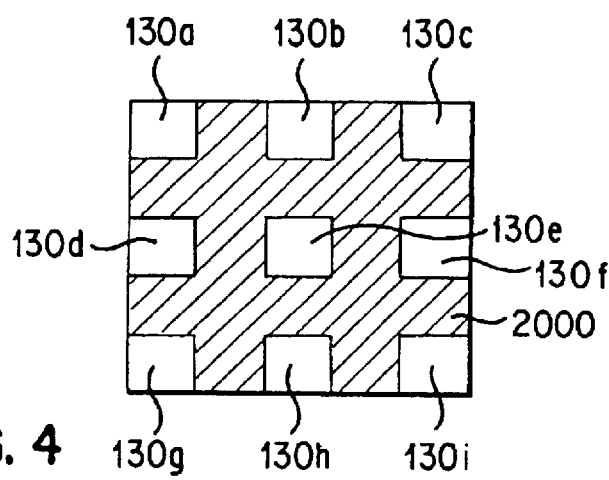
FIG. 4 is a plan view of an intermediate electrode 200 shown in FIG. 1.

FIG. 4 shows a planar pattern of the main section of the second electrode layer 200. FIG. 4 illustrates that a Plurality of openings 130a to 130i are regularly formed in the second electrode layer 300 in accordance with the present invention, and the second electrode layer 200 has, thereby, a planar network (mesh) pattern. The network pattern is effective in forming many openings while securing a desired current capacity.

As shown in the cross-sectional view (the lower side) of FIG. 2B, each of the electrodes 100, 200 and 300 can be extracted and used as wiring layers 102, 202 and 302. The device therefore has a high degree of freedom for the extraction.

Figure 5:
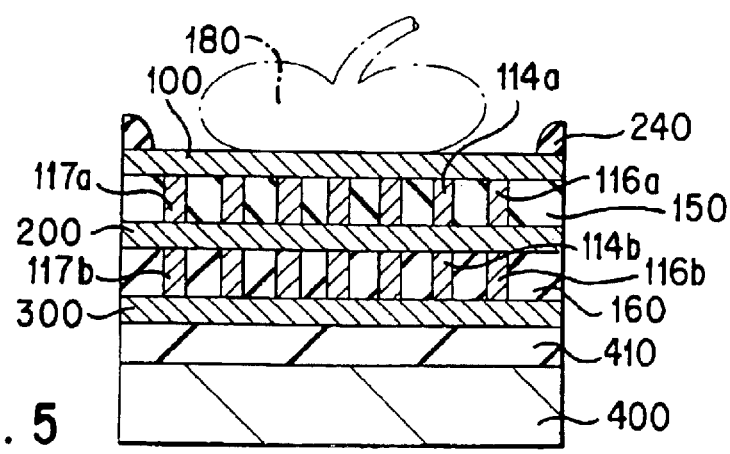
FIG. 5 is a cross-sectional view shown in FIG. 3.

As shown FIGS. 2A and 2B and FIG. 3, in this embodiment, the conductive layers 112b to 117b embedded into the through holes in the first insulating interlayer 160 and the conductive layers 112a to 117a embedded into the through holes in the second insulating interlayer 150 are arranged so as to completely overlap in the plan view. This structure is mechanically the most resistive against the vertical stress. The arrangement, however, is not limited to the structure. As shown FIG. 5, the first conductive layers 114b, 117b etc. may be slightly shifted from the second conductive layers 114a, 117a etc.

In FIGS. 2A and 2B and FIG. 3, identification number 400 represents a silicon substrate, identification number 410 represents a SiO$_2$ film covering the entire surface of the silicon substrate. Identification number 240 represents a protecting film.

Advantages in the Embodiment

According to this embodiment, the bonding pad can have a planar shape and has no bumps. When multiple metal electrode layers are formed, the bonding pad can have a planar shape. Disconnection due to bumps therefore will not occur in each layer. Further, the area of the bonding region is constant over all the layers. High density bonding pad arrangement therefore can be achieved.

Also, the second electrode 200 is provided with openings 130a to 130i, and the first insulating interlayer 160 is connected to the second insulating interlayer 150 through the openings. Props composed of insulating interlayer are, thereby, provided between the first conductive layer and the second conductive layer. Thus, no cracks form in the insulating interlayers 150 and 160 even if a load is applied during wire-bonding.

Insulating interlayers such as SiO$_2$ films are generally harder than conductive layers e.g. metal layers. If the openings 130a to 130i are not provided in the second electrode 200, the first insulating film 160 and the second insulating film 150 are mutually isolated, and these insulating interlayers are sandwiched between their respective two electrodes (100 and 200, 200 and 300).

Figure 21A:
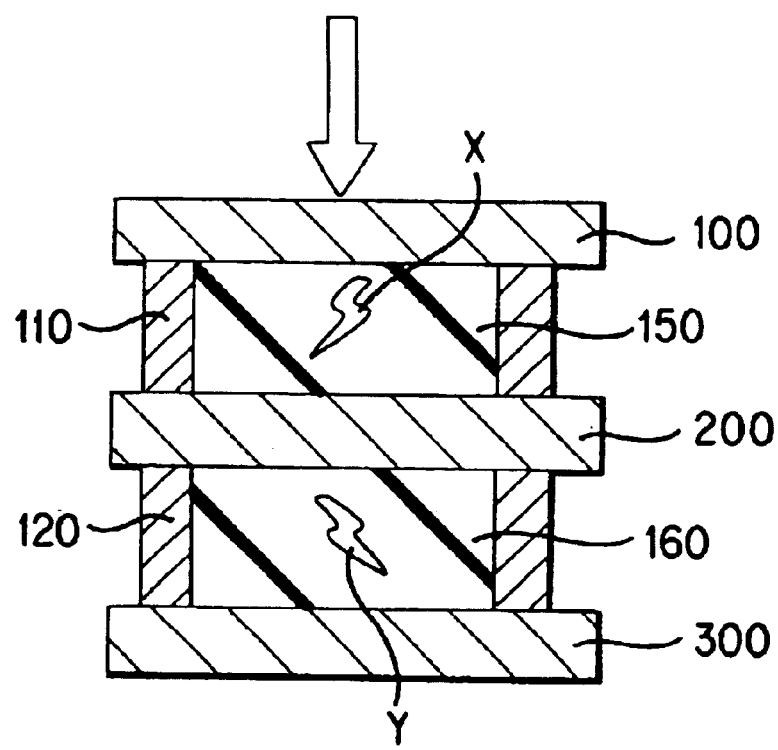
FIG. 21A illustrates a cross-sectional view of a comparative example.
Figure 21B:
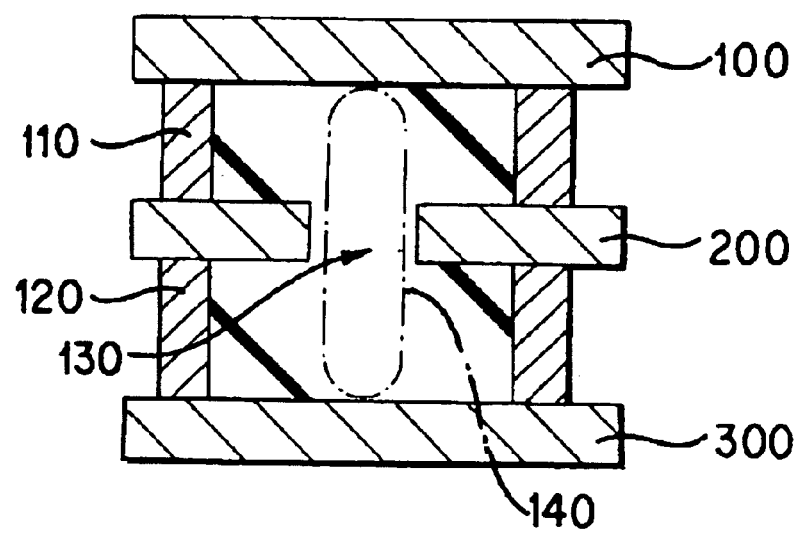
FIG. 21B illustrates a cross-section of a main section of a semiconductor device.

A load is applied during wire-bonding, the soft uppermost electrode 100 is distorted, and the distorted electrode 100 impresses the hard insulating interlayer 150. Cracks will readily form in the hard insulating interlayer 150 or 160 which is sandwiched between the two electrodes. The state of crack formation is shown in FIG. 21A. In FIG. 21A, a stress represented by an arrow is applied, cracks (X and Y) will readily form in the insulating interlayers 150 and 160.

Thus, the openings 130a to 130i are selectively provided in the electrode 200 which is arranged in the center, and the contiguous props (identification number 140 in FIG. 1) are formed so as to connecting the insulating interlayers through the openings so that the props carry a load applied to the uppermost electrode layer 100. No cracks therefore form in the insulating interlayers 150 and 160. In the present invention, hard props 140 composed of the insulating interlayer constituent are formed through the openings 130 provided in the second electrode layer 200. Thus, crack formation in the insulating interlayers as shown in FIG. 21A can be prevented. As a result, reliability of the semiconductor device is improved.

Figure 22:
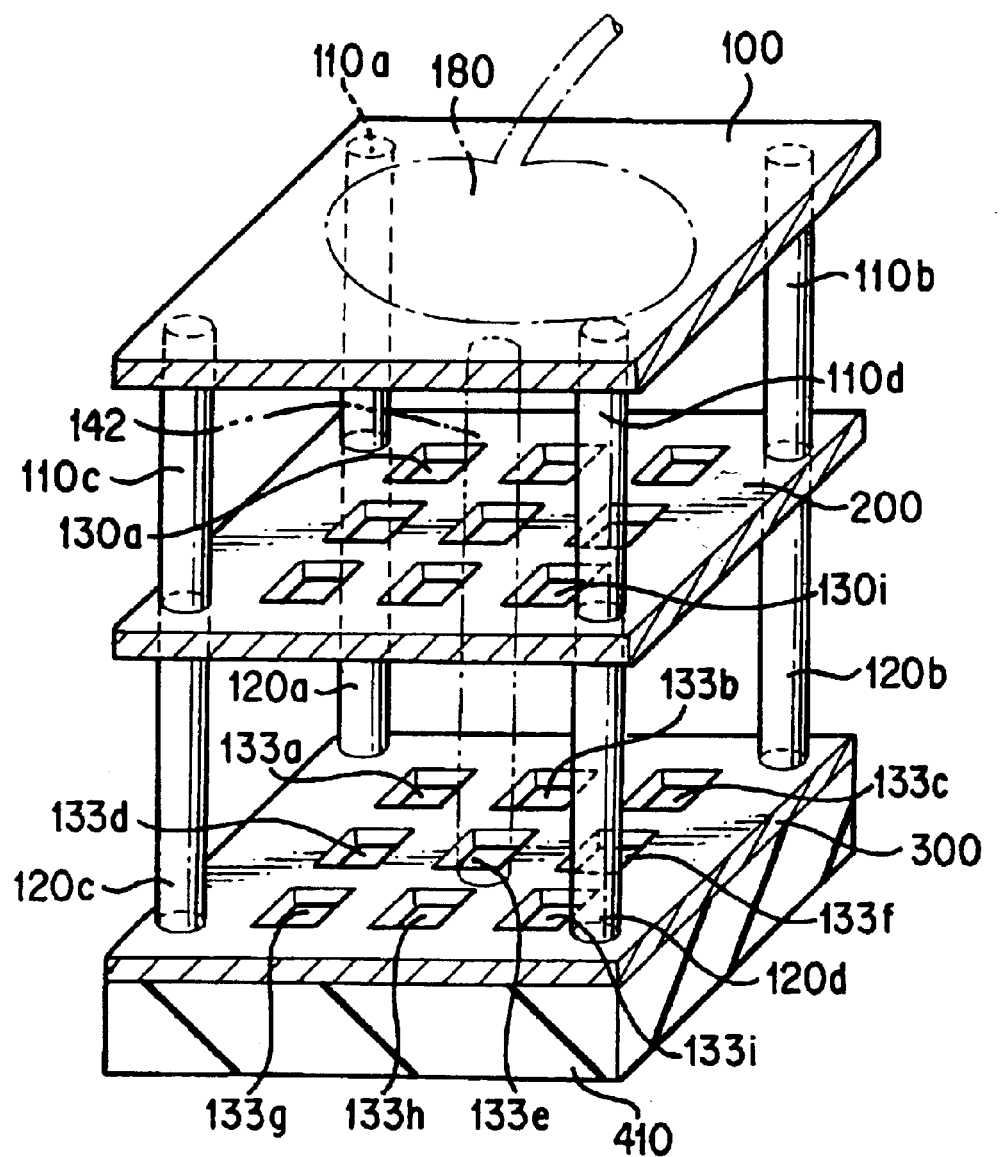
FIG. 22 illustrates a structure of a modified example of a bonding pad in a semiconductor device.
Figure 23:
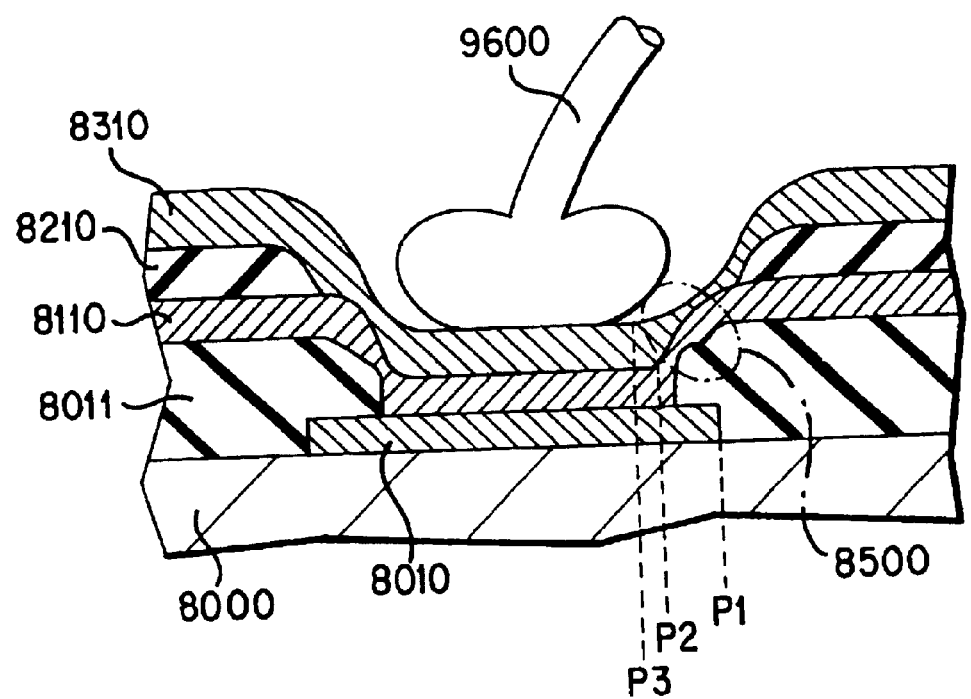
FIG. 23 illustrates problems in prior art.

In the above-mentioned example, openings are provided only in the intermediate electrode (the second electrode layer) among the three electrode layers. The opening arrangement, however, is not limited to this example, and openings may be provided in the first electrode layer (the lowest electrode layer) 300, as shown in FIG. 22. In this case, the mechanical strength of the bonding pad is further improved, and crack formation in the insulating interlayers can be further effectively reduced.

As shown in FIG. 22, since a plurality of openings 133a to 133i are provided in the first electrode layer 300 so as to overlap with those in the second electrode layer 200, props 142 composed of the insulating interlayer material are directly formed on a insulating film 410 which covers the surface of the semiconductor substrate. Thus, the third electrode layer 100 is supported with hard contiguous props 142 without intervention of a conductive layer. The strength of the bonding pad against a stress applied from the top is further improved.

It is preferable that the first electrode layer 300 be also shaped into a mesh as in the second electrode layer 200. when the first electrode layer 300 is extracted and used as wiring, many openings can be effectively formed while maintaining a high current flow density of the first conductive layer 300.

Openings may be provided in the uppermost electrode layer (the third electrode layer) 100 in which a bonding wire 180 is connected, if necessary.

In the above-mentioned examples, although three electrode layer structures have been described, the present invention is not limited to the three layers of electrode structure, and applicable to two layers, four layers and multiple layers of electrode structure. Thus, the same advantages can be achieved by employing a similar configuration as this embodiment.

Second Embodiment

Figure 6A:
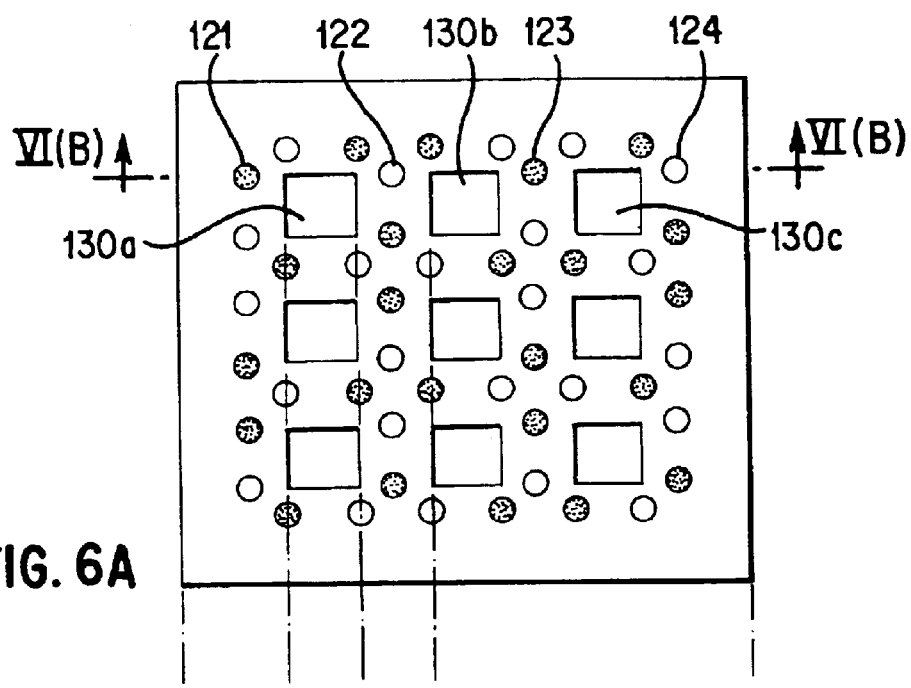
FIG. 6A is a plan view of a semiconductor device in accordance with a second embodiment.
Figure 6B:
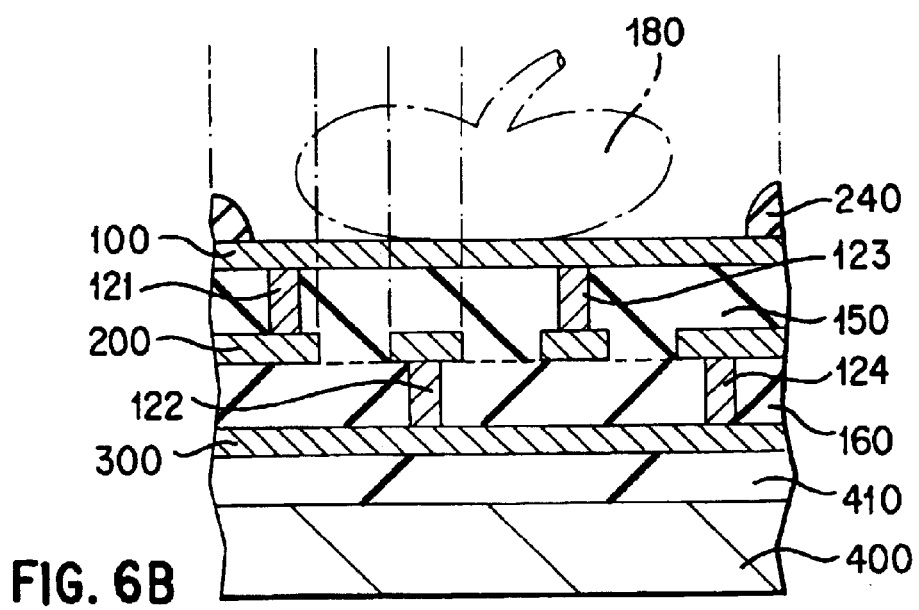
FIG. 6B is a cross-sectional view taken from line VI(B)—VI(B) of FIG. 6A.

FIG. 6A is a plan view (the upper side) and FIG. 6B is a cross-sectional view (the lower side) taken from line VI(B)—VI(B) of the plan view illustrating a configuration in accordance with a second embodiment of the present invention. In FIGS. 6A and 6B, the open circle represents a conductive layer embedded into through holes in a first insulating interlayer 160, and the black dot represents a conductive layer embedded into through holes in a second insulating interlayer 150.

This embodiment is characterized in that the conductive layers 122, 124, etc., embedded into through holes in the first insulating interlayer 160 do not overlap with the conductive layers 121, 123, etc., embedded into through holes in the second insulating interlayer 150 in the plan view.

The configuration of conductive layers (embedded conductive layers) as shown in this embodiment can also be employed as long as a predetermined current flow capacity is secured.

Third Embodiment

Figure 7A:
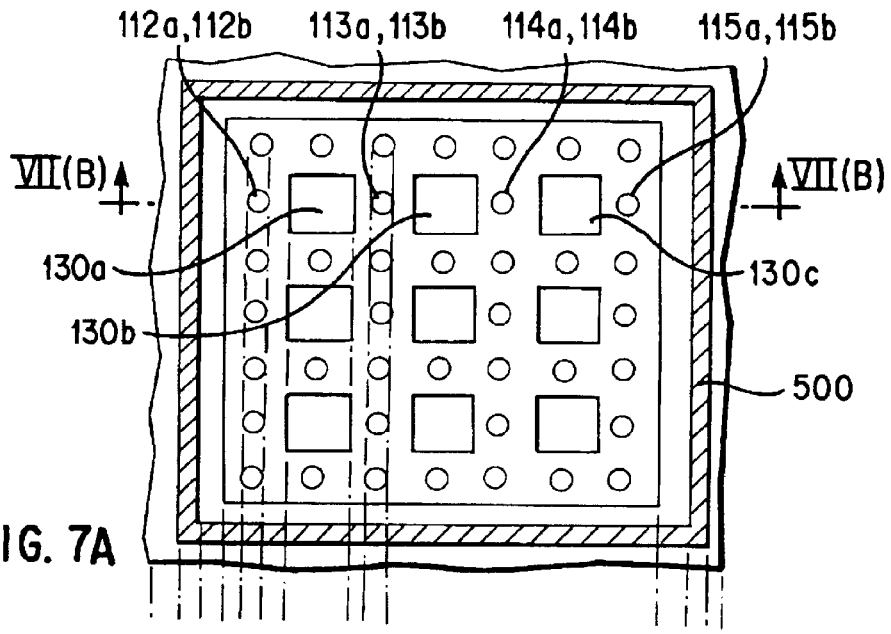
FIG. 7A is a plan view of a semiconductor device in accordance with a third embodiment.
Figure 7B:
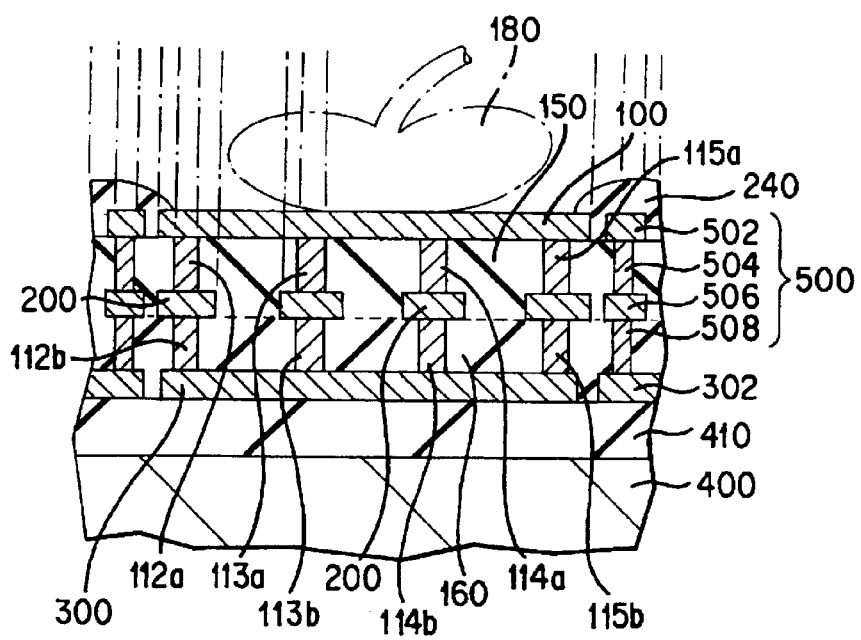
FIG. 7B is a cross-sectional view taken from line VII(B)—VII(B) of FIG. 7A.

FIG. 7A is a plan view (the upper side) and FIG. 7B is a cross-sectional view (the lower side) taken from line VII(B)—VII(B) of the plan view illustrating a configuration in accordance with a third embodiment of the present invention.

This embodiment is characterized in that a guard ring 500 is provided so as to surround the bonding pad.

As shown in the cross-sectional view of FIG. 7B, the guard ring 500 has the same structure as the bonding pad shown in FIG. 1. to FIG. 3 and comprises conductive layers 302, 502, 508, 506 and 504. The guard ring is formed by the same process as in the bonding pad structure shown in FIG. 1 to FIG. 3.

If some cracks form in the insulating interlayers 150 and 160, the guard ring 500 can prevent propagation of the cracks to the circumference. The guard ring 500 also prevents penetration of water which enters through the bonding wire 180 or from the circumference of the chip. Reliability of the semiconductor device therefore is improved.

Figure 8:
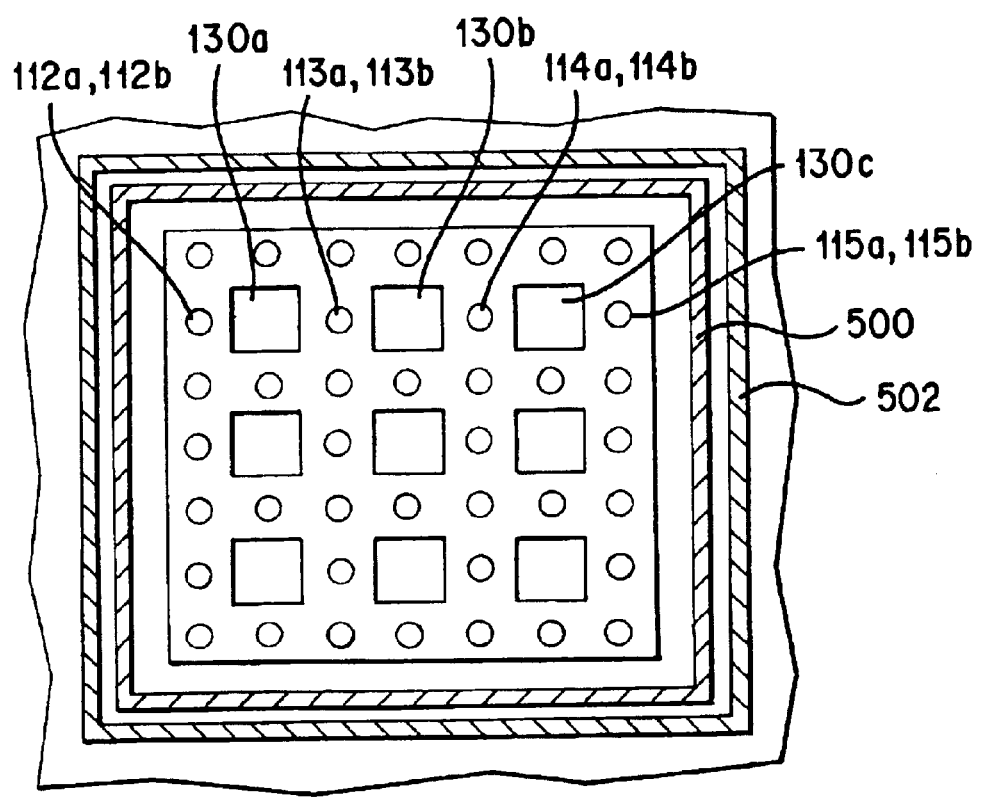
FIG. 8 is a plan view illustrating a modification of the semiconductor device of FIG. 7A.

In an example shown in FIG. 8, another guard ring 502 is provided outside the guard ring 500. Such a configuration enhances the effects to prevent the crack propagation and water penetration.

Fourth Embodiment

Figure 9A:
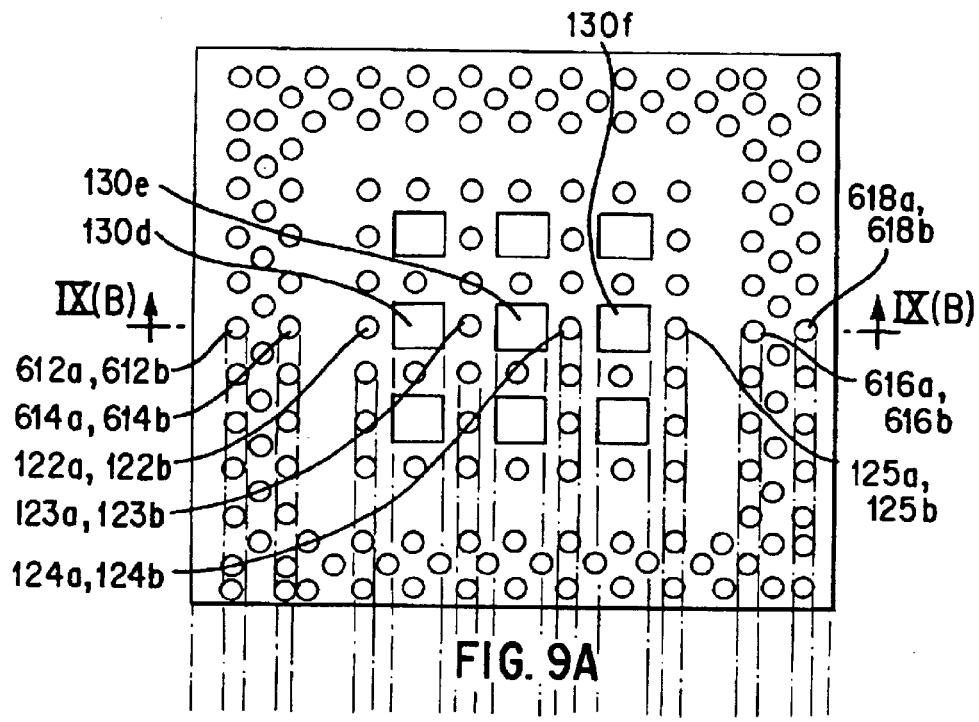
FIG. 9A is a plan view of a semiconductor device in accordance with a fourth embodiment.
Figure 9B:
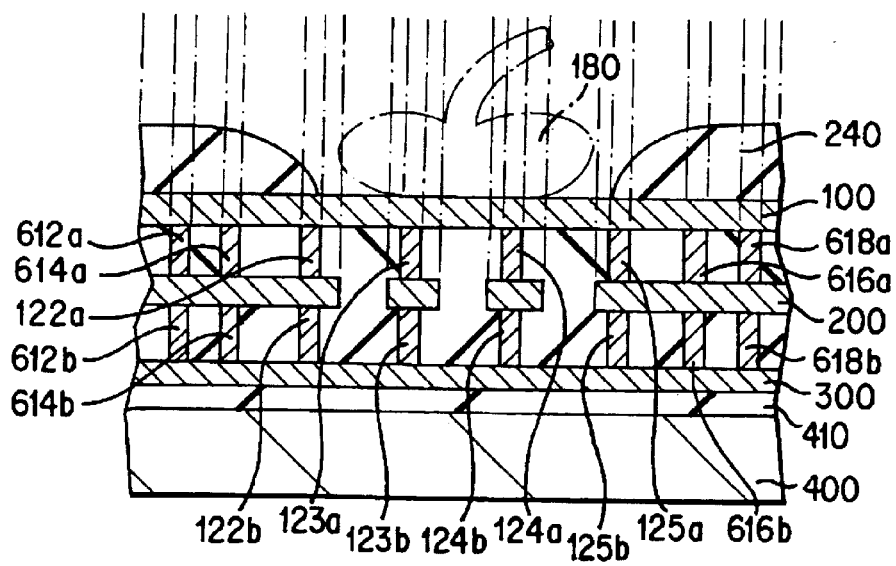
FIG. 9B is a cross-sectional view taken from line IX(B)—IX(B) of FIG. 9A.

FIG. 9A is a plan view (the upper side) and FIG. 9B is a cross-sectional view (the lower side) taken from line IX(B)—IX(B) of the plan view illustrating a configuration in accordance with a fourth embodiment of the present invention.

This embodiment is characterized in that conductive layers, which are composed of the same material as the conductive layer for connecting to electrode layers each other in the bonding pad, are embedded instead of providing a guard ring. The same advantages as in the guard ring can be achieved thereby.

In FIGS. 9A and 9B, identification numbers 612a, 612b, 614a, 614b, 616a, 616b, 618a and 618b represent conductive layers which play the same role as the guard ring. High density arrangement of the conductive layers is preferred in order to enhance the effects for preventing crack propagation and water penetration.

Fifth Embodiment

A manufacturing process of a bonding pad having a configuration as shown in FIG. 1 to FIG. 4 will now be described.

Figure 10:
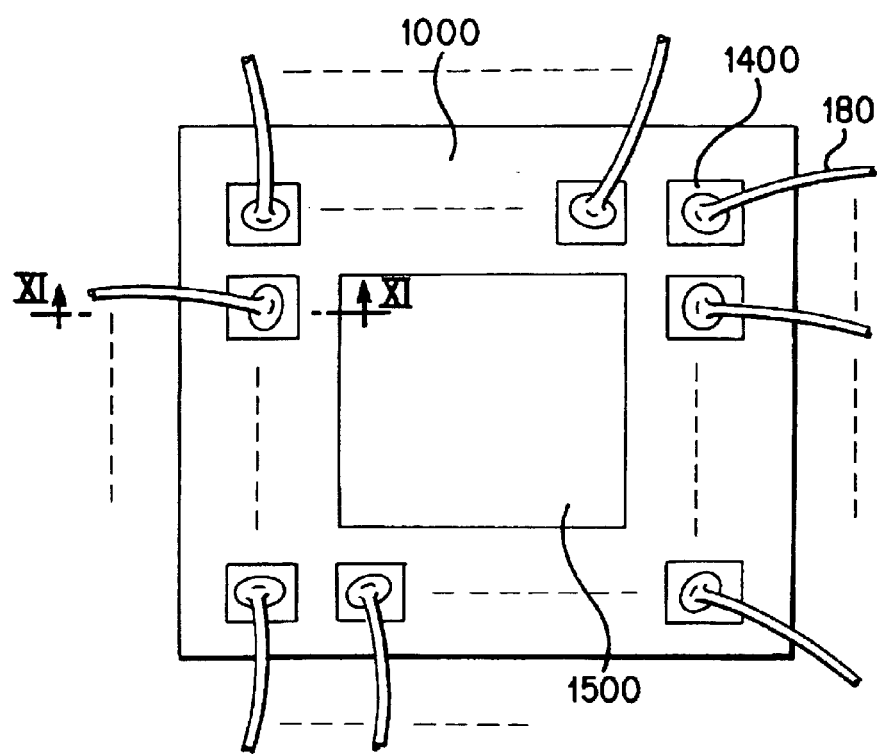
FIG. 10 illustrates an arrangement of a bonding pad and an internal circuit in a semiconductor chip.

The bonding pads shown in FIG. 1 to FIG. 4 are arranged around a semiconductor chip 1000, for example, as shown in FIG. 10, and a bonding wire 180 is connected to each bonding pad. In FIG. 10, the bonding pad is referred to with identification number 1400. An internal circuit 1500 is formed in the central section of the semiconductor chip 1000.

Figure 11:
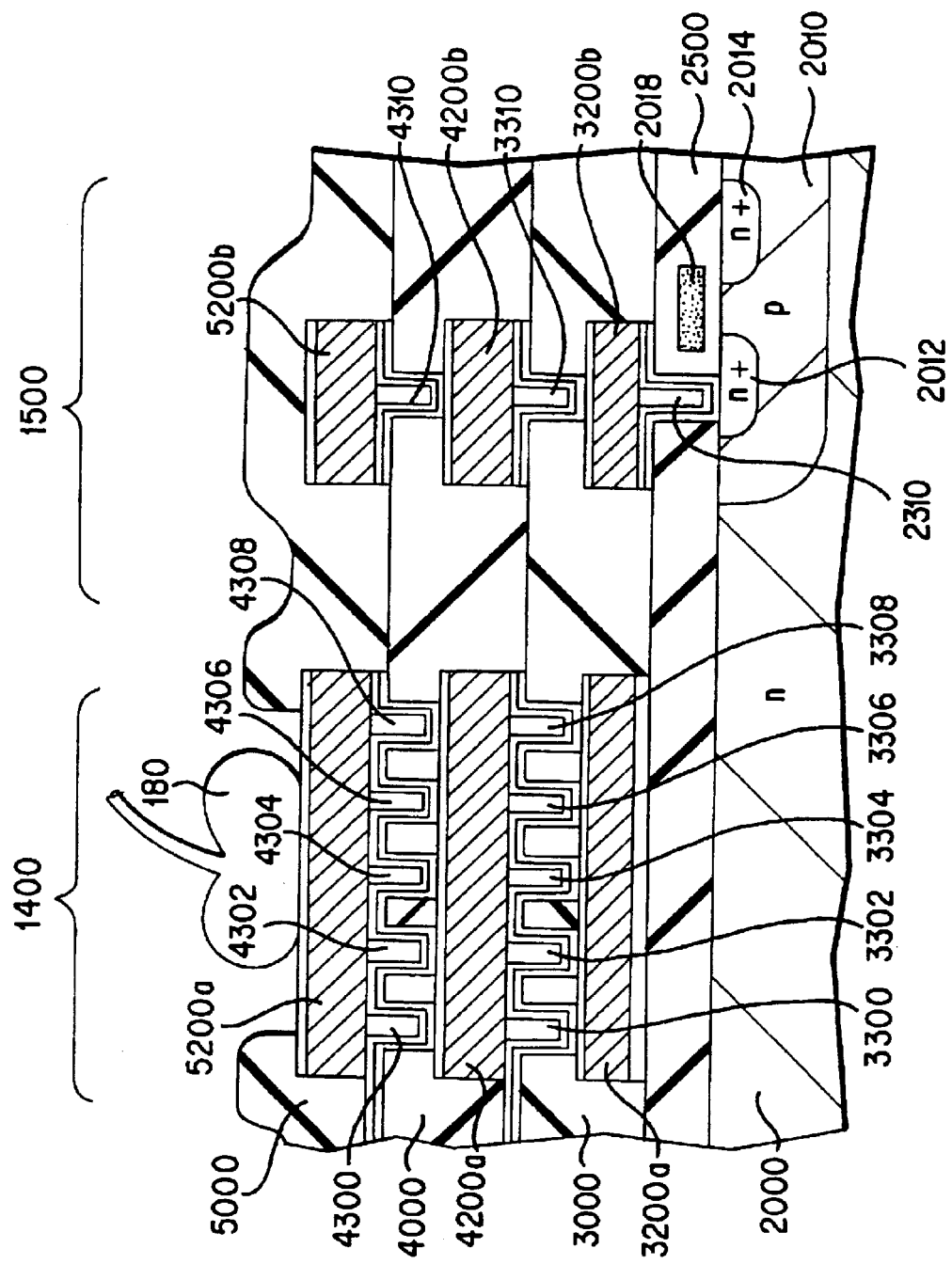
FIG. 11 is a cross-sectional view illustrating a first step in a method for making a semiconductor device.

FIG. 11 is a cross-sectional view taken from line XI—XI in FIG. 10. In FIG. 11, the left side of the drawing represents a configuration of the bonding pad 1400 and the right side represents a configuration of the internal circuit 1500. The cross-sectional configuration of the bonding pad 1400 corresponds to the cross-sectional configuration shown in FIG. 3.

The manufacturing process for the configuration in FIG. 11 will now be described step by step with reference to FIG. 12 to FIG. 17.

Figure 12:
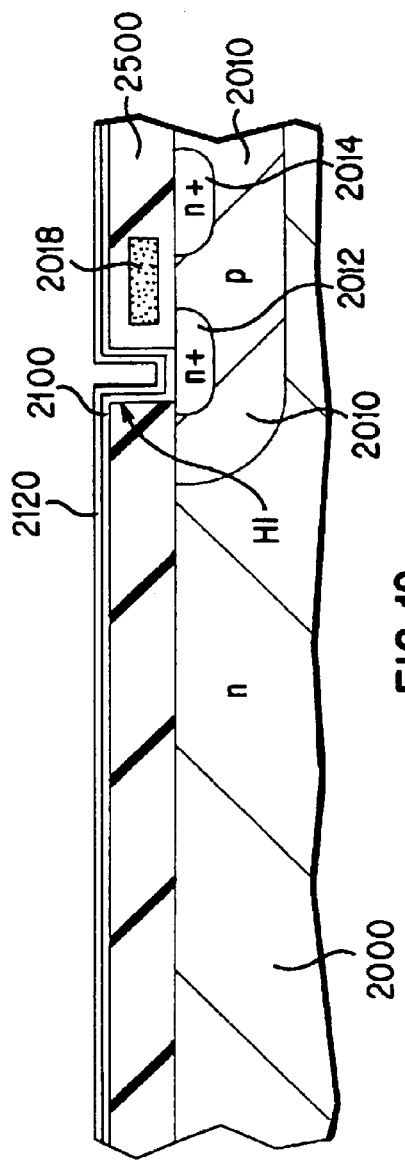
FIG. 12 is a cross-sectional view illustrating a second step in a method for making a semiconductor device.

As shown in FIG. 12, a gate electrode 2018 composed of polysilicon or the like, a p-well layer 2010, and $n^+$-layers 2012 and 2014 are formed on a semiconductor substrate 2000 to form a MOS transistor. A predetermined electronic circuit is formed thereby.

A contact hole H1 is provided in an insulating film 2500, and a titanium (Ti) film 2100 and a titanium nitride (TiN) film 2120 are deposited step by step on the entire upper surface. The titanium (Ti) film can decrease the contact resistance. The titanium nitride (TiN) film helps embedding of tungsten (W) into the contact hole in the following step.

Figure 13:
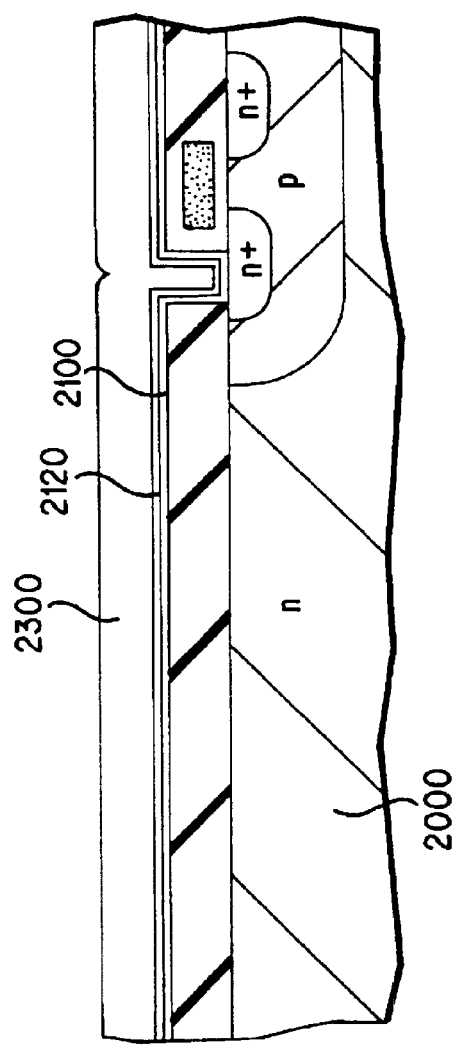
FIG. 13 is a cross-sectional view illustrating a third step in a method for making a semiconductor device.

A tungsten (W) layer 2300 is formed as shown in FIG. 13.

Figure 14:
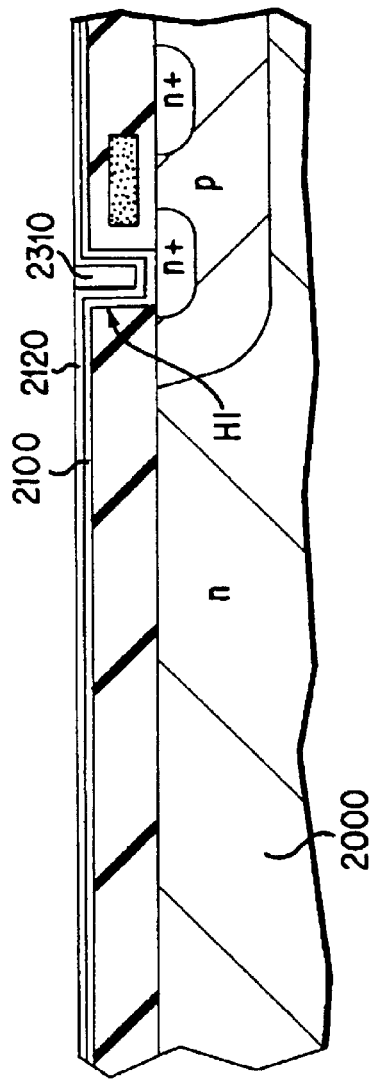
FIG. 14 is a cross-sectional view illustrating a fourth step in a method for making a semiconductor device.

Next, as shown in FIG. 14, the entire surface of the tungsten layer 2300 is etched with a reactive ion etching (RIE) system to embed tungsten (W) into the contact hole H1. An embedded tungsten layer 2310 is formed thereby. The etching is performed with, for example, a dry etching system at an RF power of 300 W and a vacuum pressure of 240 mTorr using gaseous Ar (90 sccm) as a carrier gas and $SF_6$ (110 sccm) as an etching gas.

A fluorine gas used for the etching of the tungsten layer in the RIE process generally causes corrosion of aluminum wiring. In the present invention, however, the bonding pad section and the multiple wiring section of the internal circuit are simultaneously formed, and thus the fluorine gas does not cause corrosion of the electrodes in the bonding pad section. Reliability of the IC chip therefore is improved.

Figure 15:
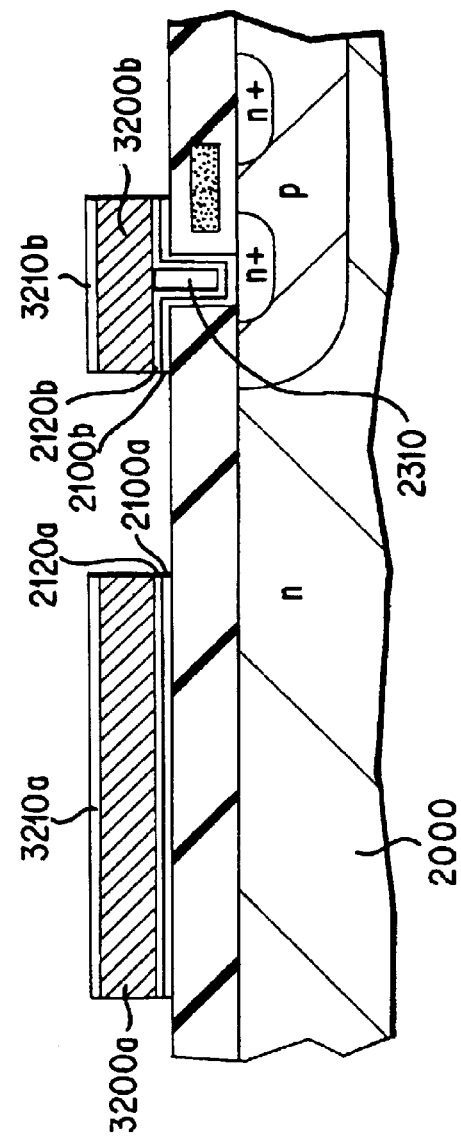
FIG. 15 is a cross-sectional view illustrating a fifth step in a method for making a semiconductor device.

Next, aluminum (Al) and titanium nitride (TiN) are deposited step by step, and the substrate is subjected to a conventional photolithographic process to form aluminum electrodes (3200a and 3200b, 3210a and 3210b) as shown in FIG. 15. As shown in FIG. 22, when openings 133a to 133i are selectively provided in the first electrode layer of the bonding pad, these openings are formed at predetermined positions in this photographic process for the electrodes (3200a and 3200b, 3210a and 3210b). Herein, the titanium nitride (TiN) films 3210a and 3210b prevent reflection of light during exposure. Namely, the film acts as an antireflection layer.

Next, an insulating interlayer 3000 is formed as shown in FIG. 16.

Next, a plurality of through holes are selectively formed in the insulating interlayer 3000 as shown in FIG. 17, and a second electrode layer is formed by the same manufacturing process shown in FIG. 12 to FIG. 15. In FIG. 17, identification numbers 3400a and 3400b represent titanium (Ti) films, identification numbers 3410a and 3410b represent titanium nitride (TiN) films, identification numbers 3300, 3302, 3304, 3306, 3308, 3310 represent tungsten (W) layers, identification numbers 4200a and 4200b represent aluminum (Al) films, and identification numbers 4210a and 4210b represent antireflection layers composed of titanium nitride (TiN) films. Openings 130a to 130i as shown in FIG. 1 are selectively formed in this step.

Figure 18:
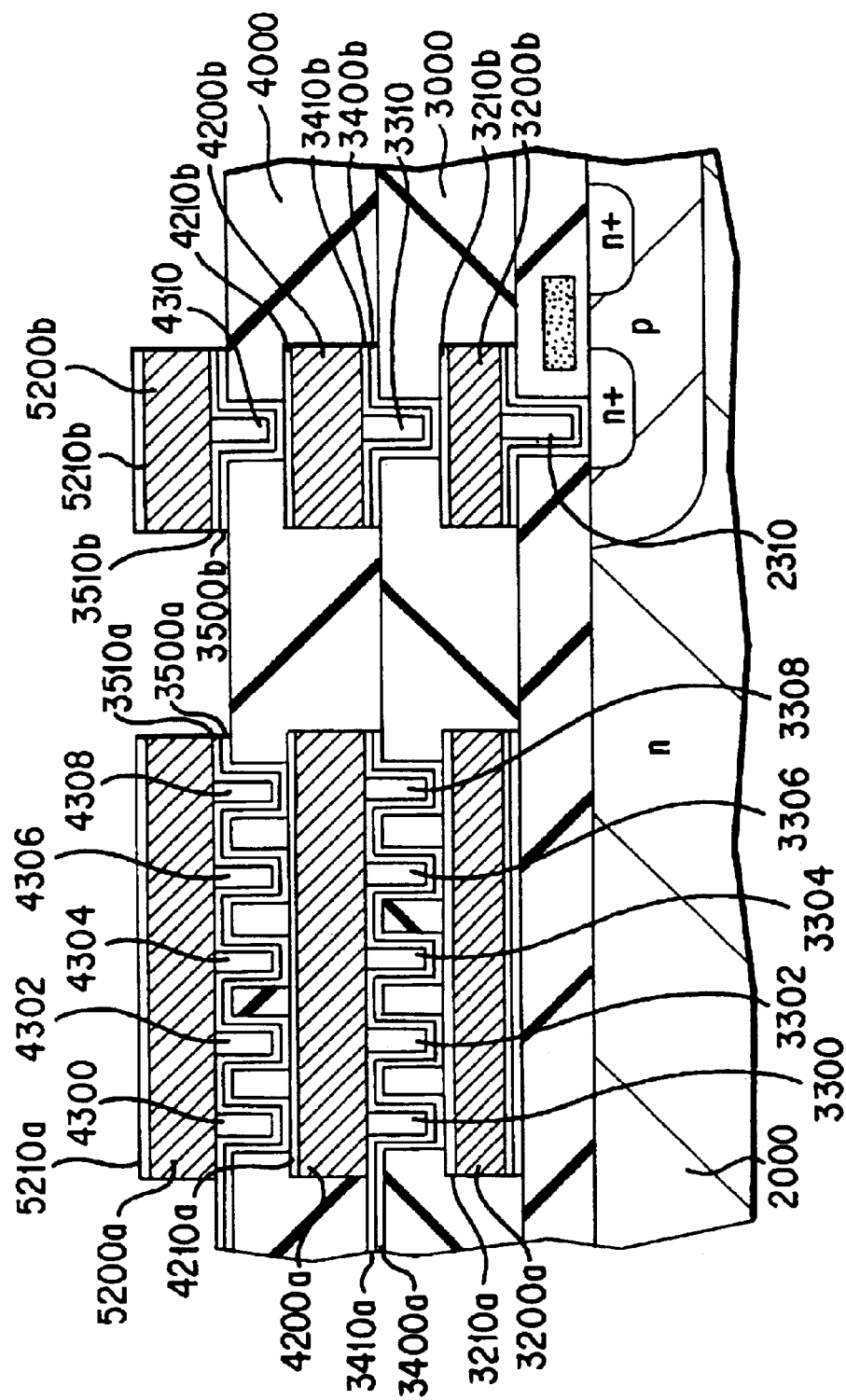
FIG. 18 is a cross-sectional view illustrating a eighth step in a method for making a semiconductor device.

As shown in FIG. 18, an insulating interlayer 4000 is formed, a plurality of through holes are formed in the insulating interlayer 4000, and a third electrode layer is formed by the same manufacturing process as in FIG. 12 to FIG. 15. In FIG. 18, identification numbers 3500a and 3500b represent titanium (Ti) films, identification numbers 3510a and 3510b represent titanium nitride (TiN) films, reference numerals 4300, 4302, 4304, 4306, 4308 and 4310 represent tungsten (W) layers, identification numbers 5200a and 5200b represent aluminum (Al) electrodes, and identification numbers 5210*a* and 5210*b* represent antireflection layers composed of titanium nitride (TiN) films.

Figure 19:
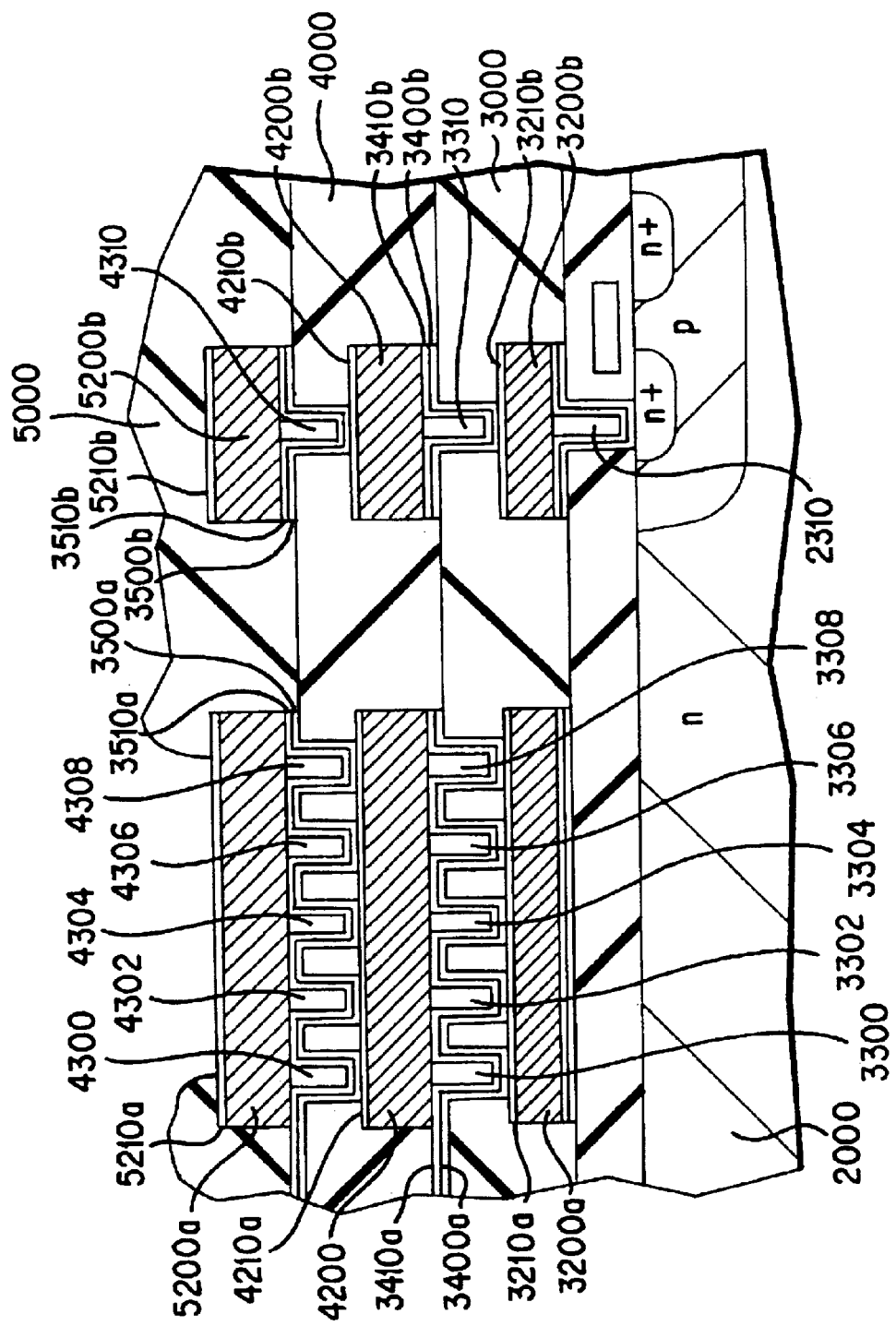
FIG. 19 is a cross-sectional view illustrating a ninth step in a method for making a semiconductor device.

Next, a final protective film 5000 is formed as shown in FIG. 19 and a part of the film is selectively opened to form a region for connecting to a bonding wire.

A bonding wire 180 is connected to the third electrode layer to complete the configuration shown in FIG. 11.

Sixth Embodiment

Figure 20:
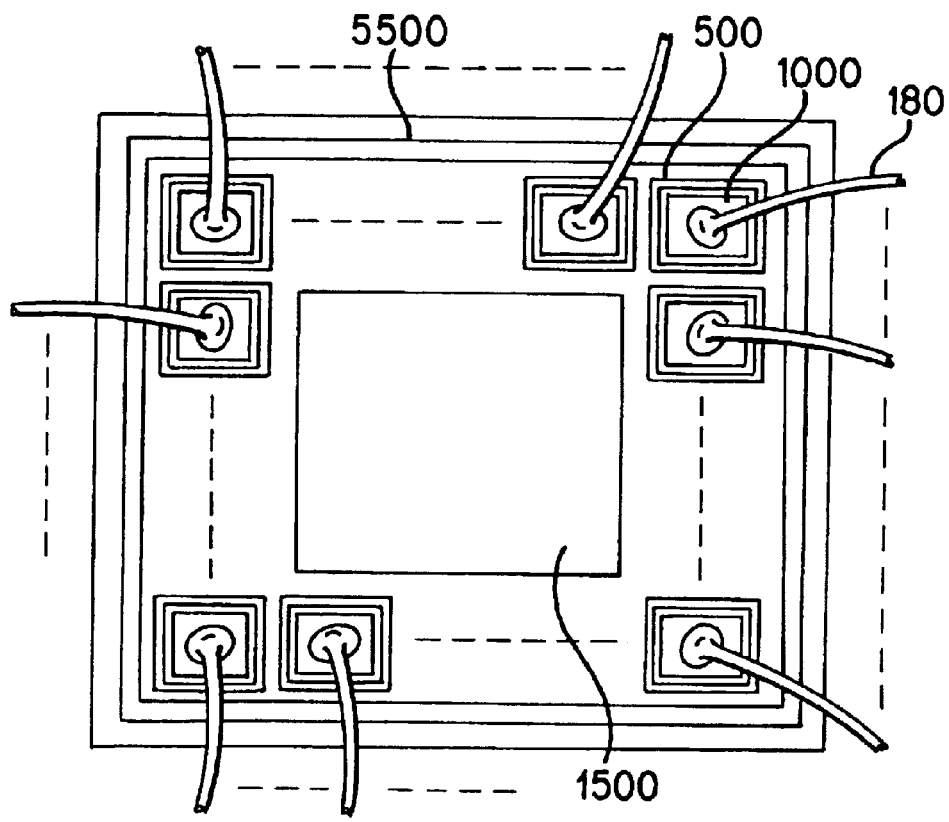
FIG. 20 is a plan view of a device in accordance with a sixth embodiment.

FIG. 20 is a plan view illustrating a configuration in accordance with a sixth embodiment of the present invention.

This embodiment is characterized in that a first guard ring 500 is provided on the periphery of the bonding pad 1000, and a second guard ring 5500 is provided on the periphery of the semiconductor chip.

As illustrated with reference to FIG. 3, the first guard ring 500 prevents the propagation of crack formed in the insulating interlayer in the bonding pad and the penetration of water.

The second guide ring 5500 prevents the penetration of water from the circumference of the semiconductor chip. The semiconductor chip therefore has further improved humidity resistance.

The first guard ring 500, the second guard ring 5500 and the multiple wiring layer structure in the internal circuit 1500 can be produced by a collective production process.

The present invention is widely applicable to substrates using thin films in liquid crystal devices, as well as monolithic ICs. The materials usable for external connection are not limited to the bonding wire and include tape carriers and bump electrodes for direct packaging of semiconductor chips on substrates (flip chip packaging).

While this invention has been described in conjunction with specific embodiments thereof, it is evident that many alternatives, modifications and variations would be apparent to those skilled in the art. Accordingly, preferred embodiments of the invention as set forth herein are intended to be illustrative, not limiting. Various changes may be made without departing from the spirit and scope of the invention as defined in the following claims.

What is claimed is:

1. A semiconductor device including a bonding pad, wherein the bonding pad is a multiple wiring layer structure, the bonding pad comprising:

a first conductive layer connected to a conductive member for external connection;

a second conductive layer disposed below said first conductive layer, the second conductive layer having a plurality of openings forming a planar lattice conductive pattern;

a third conductive layer disposed below said second conductive layer, wherein said plurality of openings are sandwiched between the first and third conductive layers;

a first insulating interlayer disposed between said first conductive layer and said second conductive layer;

at least one first through hole provided in said first insulating interlayer;

a fourth conductive layer filling said at least one first through hole;

a second insulating interlayer disposed between said second conductive layer and said third conductive layer;

at least one second through hole provided in said second insulating interlayer wherein said at least one first through hole is disposed substantially directly above said at least one second through hole; and a fifth conductive layer filling said at least one second through hole, wherein said first insulating interlayer and said second insulating interlayer are connected to each other through said openings of said second conductive layer, and a contiguous section of said first insulating interlayer with said second insulating interlayer is, thereby, formed between said first conductive layer and said third conductive layer.

2. The semiconductor device according to claim 1, wherein said conductive member for external connection is a bonding wire.

3. The semiconductor device according to claim 1, wherein said first conductive layer, said second conductive layer and said third conductive layer comprise aluminum as a major component, and said fourth conductive layer and said fifth conductive layer comprise tungsten as a major component.

4. The semiconductor device according to claim 1, wherein said semiconductor device further comprises an internal circuit, said internal circuit being formed by the multiple wiring layer structure, and said first conductive layer, said second conductive layer, said third conductive layer, said fourth conductive layer, said fifth conductive layer, said first insulating interlayer, said second insulating interlayer, said through holes, and said multiple wiring layer structure are formed by a collective production process.

5. The semiconductor device according to claim 1, wherein the first and second through holes are axially aligned.

6. The semiconductor device according to claim 1, wherein the first and second through holes are axially offset.

7. The semiconductor device according to claim 1, wherein the fourth and fifth conductive layers do not overlap.

\* \* \* \* \*